(12) United States Patent
Smith

(10) Patent No.: US 6,480,263 B1
(45) Date of Patent: Nov. 12, 2002

(54) APPARATUS AND METHOD FOR PHASE SHIFT PHOTOMASKING

(75) Inventor: Bruce W. Smith, Webster, NY (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/526,592

(22) Filed: Mar. 16, 2000

Related U.S. Application Data

(60) Provisional application No. 60/105,281, filed on Oct. 22, 1998, provisional application No. 60/119,780, filed on Feb. 11, 1999, and provisional application No. 60/124,614, filed on Mar. 16, 1999.

(51) Int. Cl.[7] ............... G03B 27/52; G03B 27/68; G03B 27/42
(52) U.S. Cl. ............... 355/71; 355/52; 355/53; 355/55
(58) Field of Search ............... 355/52, 53, 55, 355/67–71, 77; 356/399–401; 430/5, 20, 22

(56) References Cited

U.S. PATENT DOCUMENTS

| | | | | |
|---|---|---|---|---|
| 5,345,292 A | * | 9/1994 | Shiozawa et al. | 355/67 |
| 5,627,625 A | * | 5/1997 | Ogawa | 355/53 |
| 5,644,383 A | | 7/1997 | Mori | |
| 5,982,476 A | * | 11/1999 | Uematsu | 355/67 |
| 6,016,187 A | | 1/2000 | Noguchi et al. | 355/53 |
| 6,259,512 B1 | * | 7/2001 | Mizouchi | 355/67 |
| 6,320,648 B1 | * | 11/2001 | Brueck et al. | 355/67 |

OTHER PUBLICATIONS

Levenson, Marc D., et al., "Improving Resolution in Photolithography with a Phase–Shifting Mask", *IEEE Transactions on Electron Devices*, vol. ED 29, No. 12, Dec. 1982, pp. 1828–1836.

Smith, Bruce W., "Variations to the Influence of Lens Aberration Invoked with PSM and OAI", *Rochester Institute of Technology*, SPIE 3679–31, (1999), pp. 1–17.

Smith, Bruce W., et al., "Influences of Off–Axis Illumination on Optical Lens Aberration", *J. Vac. Science Technology*, B 16(6), Nov./Dec. 1998, pp. 3405–3410.

Smith, Bruce W., "Revalidation of the Rayleigh Resolution and DOF Limits", *Rochester Institute of Technology*, SPIE 3334–14 (1998, pp. 1–12.

* cited by examiner

*Primary Examiner*—Russell Adams
*Assistant Examiner*—Hung Henry Nguyen
(74) *Attorney, Agent, or Firm*—Pillsbury Winthrop LLP

(57) ABSTRACT

A photolithographic method and apparatus are disclosed. The apparatus uses a diffraction plate or traditional optical elements to control and shape the light from an illuminator into a Gaussian light intensity distribution for illuminating a phase shift photomask. The Gaussian distribution reduces asymmetrical aberrations of the objective lens that are exaggerated by the phase shift photomask.

30 Claims, 11 Drawing Sheets

APPARATUS AND METHOD FOR PHASE SHIFT PHOTOMASKING

CROSS-REFERENCE TO RELATED APPLICATIONS

This patent is a conversion of U.S. Provisional Application Serial No. 60/124,614, filed Mar. 16, 1999, This patent claims the benefit of the priority date of the following U.S. Applications: Regular application Ser. No. 09/422,398 filed Oct. 21, 1999, Provisional Application No. 60/124,614 filed Mar. 16, 1999, Provisional Application Serial No. 60/105,281 filed Oct. 22, 1998 and Provisional Application Serial No. 60/119,780, filed Feb. 11, 1999, This patent incorporates by reference all the disclosure found in each of the related application identified above.

BACKGROUND OF THE INVENTION

Optical lithography is a driving force behind the continual improvements in the size and performance of the integrated circuit (IC) since its inception. Feature resolution down to 0.25 µm is now routine using a 248 nm KrF excimer wavelength and optical projection tools operating at numerical apertures above 0.60 with aberration levels below 0.04 $\lambda$ RMS OPD. The industry is at a point where resolution is limited for current optical lithographic technologies. In order to extend capabilities toward sub-0.25 µm, modifications in source wavelength, optics, illumination, masking, and process technology are required and are getting very much attention. Off-axis illumination and phase shift photomasks contribute to extending the range of optical lithography below 0.25 microns.

However, as devices get smaller, the photomask pattern becomes finer. Fine patterns diffract light and thus detract from imaging the photomask onto the surface of a wafer. FIG. 1a shows what happens when a photomask with a fine pattern 6 having a high frequency (pitch 2d is about several microns), is illuminated through a projection lens system 7, The fine pattern 6 is illuminated along a direction perpendicular to the surface thereof and it diffracts the light that passes through the mask 6, Diffraction rays 3–5 caused by the pattern include a zero-th order diffraction ray 5 directed in the same direction as the direction of advancement of the input ray, and higher order diffraction rays such as positive and negative first order diffraction rays 3, 4, for example, directed in directions different from the input ray. Among these diffraction rays, those of particular diffraction orders such as, for example, the zero-th order diffraction ray and positive and negative first order diffraction rays 3, 5 are incident on a pupil 1 of the projection lens system 7, Then, after passing through the pupil 1, these rays are directed to an image plane of the projection lens system, whereby an image of the fine pattern 6 is formed on the image plane. In this type of image formation, the ray components, which are contributable to the contrast of the image, are higher order diffraction rays. If the frequency of a fine pattern increases, it raises a problem that an optical system does not receive higher order diffraction rays. Therefore, the contrast of the image degrades and, ultimately, the imaging itself becomes unattainable.

As will be shown below, some solutions to this problem rely upon shaping the rays of light impinging the photomask in order to compensate for the lost contrast due to diffraction. These techniques rely upon optical systems for shaping the rays that illuminate the photomask.

In considering potential strategies for sub-0.25 µm lithography, the identification of purely optical issues is difficult. Historically, the Rayleigh criteria for resolution (R) and depth of focus (DOF) has been utilized to evaluate the performance of a given technology:

$$R=k_1\lambda/NA$$

$$DOF=+/-k_2\lambda/NA^2$$

where $k_1$, and $k_2$ are process dependent factors, $\lambda$ is wavelength, and NA is numerical aperture. As wavelength is decreased and numerical aperture is increased, resolution capability improves. Considered along with the wavelength-linear and NA-quadratic loss in focal depth, reasonable estimates can be made for system performance. Innovations in lithography systems, materials and processes that are capable of producing improvements in resolution, focal depth, field size, and process performance are those that are considered most practical.

The control of the relative size of the illumination system numerical aperture has historically been used to optimize the performance of a lithographic projection tool. Control of this NA with respect to the projection systems objective lens NA allows for modification of spatial coherence at the mask plane, commonly referred to partial coherence. This is accomplished through specification of the condenser lens pupil size with respect to the projection lens pupil in a Köhler illumination system. Essentially, this allows for manipulation of the optical processing of diffraction information. Optimization of the partial coherence of a projection imaging system is conventionally accomplished using full circular illuminator apertures. By controlling the distribution of diffraction information in the objective lens with the illuminator pupil size, maximum image modulation can be obtained.

Phase shift masking also contributes to sub 0.25-micron lithography. Prior to the work of Levenson, et. al., as reported in "Improving Resolution in Photolithography with a Phase Shifting Mask," IEEE Transactions on Electron Devices, VOL., ED-29, Nov. 12, Dec. 1982, pp. 1828–1836, it was generally thought that optical lithography would not support the increased density patterning requirements for feature sizes under 0.5 microns. At this feature size, the best resolution has demanded a maximum obtainable numerical aperture (NA) of the lens systems. However, the depth of field of the lens system is inversely proportional to the NA, and since the surface of the integrated circuit could not be optically flat, good focus could not be obtained when good resolution was obtained and it appeared that the utility of optical lithography had reached its limit. The Levenson paper introduced a new phase shifting concept to the art of mask making which has made use of the concepts of destructive interference to overcome the diffraction effects. See also U.S. Pat. No. 5,702,848.

Ordinary photolithography, with diffraction effects, is illustrated in FIGS. 3(a) to 3(d). As the mask features P1 and P2 become closer, N becomes smaller, and as seen in FIG. 3(b), the light amplitude rays, which pass through P1 and P2, start to overlap due to diffraction effects. These overlapping portions result in light intensity at the wafer, FIG. 3(d), which impinges on the photoresist layer. Accordingly, due to diffraction, the intensity of the wafer no longer has a sharp contrast resolution in the region between P1 and P2.

As illustrated by FIGS. 4(a) to 4(e), it is possible to make use of the fact that light passing through the masking substrate material, FIG. 4(a), 51, (and FIG. 4(b), 51') exhibits a wave characteristic such that the phase of the amplitude of the light exiting from the mask material is a function of the distance the light ray travels in the substrate material, i.e., thickness t.sub.1 and t.sub.2, By making the thickness t.sub.2 such that (n−1)(t.sub.2) is exactly equal to ½ .lambda., where .lambda. is the wavelength of the light in the mask material, and n=refractive index of the added or subtracted natural material, then the amplitude of the light existing from aperture P2 is in opposite phase from the light exiting aperture P1. This is illustrated in FIG. 4(c) showing the effects of diffraction and use of interference cancellation. The photoresist material is responsive to the intensity of the light at the wafer. Since the opposite phases of light cancel where they overlap and since intensity is proportional to the square of the resultant amplitude, as seen in FIG. 4(d) contrast resolution is returned to the pattern.

FIG. 4(a) and FIG. 4(b) illustrate two different techniques for obtaining the interference phase shifting. In FIG. 4(a), the light traverses through a longer distance via deposited layer 52, In FIG. 4(b), the light in region P2 transverses through a shorter distance by virtue of an etched groove 52' in the wafer 51'. The etched depth or shifter film thickness is designed to produce the desired 180 degree phase shift at the proper incident wavelength (for example, I-line or DUV).

Lithographic imaging for semiconductor integrated circuit (IC) device fabrication is sensitive to the lens aberrations in a projection lens. This becomes especially critical as geometries are pushed toward and below the wavelength of illumination. The use of phase-shift masking has been introduced in many forms to push the resolution limitations of optical lithography. A critical concern with phase shift masking is the influence that these approaches have on the impact of aberrations on imaging. FIG. 5 shows how a lens pupil is utilized with strong alternating phase shift masking. Here, only a certain radial portion of a lens pupil is utilized by diffraction information. Because of this, symmetrical aberrations such as defocus and spherical aberration can be significantly reduced. Variations on strong phase-shift masking can produce similar diffraction order distribution in the lens pupil. Problems will exist with any asymmetrical aberrations that may be present in a lens, including for example coma and astigmatism. These aberrations give rise to such things as image placement error and X/Y biases. Phase shift masking can cause this aberration to more strongly influence imaging.

One technique for solving the problem is to improve the lens with reduced aberrations. Current lenses exhibit very low aberration levels (<0.04 waves) making significant improvement difficult. Furthermore, tools cost millions of dollars and owners expect to use them for several generations of devices. As such there is an unmet need to improve the performance of existing lens technology.

SUMMARY OF THE INVENTION

I discovered a practical solution that can be adapted to existing lithography tools and also to new tools. Prior art tools strive to provide a "top hat" illumination intensity pattern. Such a pattern provides substantially uniform illumination across the entire circular aperture. Existing illumination systems are designed to reduce or eliminate variations in illumination. It is known that phase shift masking exacerbates aberrations of the projection lens. I have discovered that the increased impact of aberration on imaging introduced by phase shift masking could be reduced by controlling the intensity across the condenser lens aperture to provide a Gaussian distribution of light.

A typical photolithographic tool or apparatus includes an objective lens that projects an image from the phase shift photomask onto a photosensitized surface of a semiconductor wafer. The apparatus has an illuminator that generates a distribution of light. The illuminator projects its light onto the phase shift mask. That mask carries an object pattern. The objective lens receives and relays the pattern onto a photosensitive surface of a semiconductor wafer. The objective lens has aberrations.

Some are symmetrical (such as defocus and spherical) and others are asymmetrical (such as coma and astigmatism). The phase shift photomask can exacerbate these aberrations and especially the asymmetrical aberrations. My invention reduces the adverse effects of the phase shift photomask on the lens aberrations, especially asymmetrical aberrations. The invention applies a Gaussian-type distribution of light intensity to the beam of light from the illuminator.

The invention illuminates a phase-shift mask with a Gaussian or other similar distribution of energy. This method of illumination is superior to conventional circular illumination and reduces the influence of aberrations. Symmetrical aberration influence can be reduced over full pupil utilization, as is the case with conventional low-sigma circular illumination of a phase shift mask The influence of asymmetrical aberrations is further reduced compared to either full pupil utilization or conventional circular illumination of a phase shift mask. This superior method of illumination will result in significant reduction in image degradation, image placement error, and X/Y feature biasing.

In one embodiment of the invention a shaped illumination approach is described that allows for illumination of a photomask in a projection exposure tool. There is a desire for a flexible technique that can be incorporated into most existing or future generation projection exposure tools with a minimum amount of illumination system retrofitting. It is important that such an improvement be easily changed to allow a return to other operation conditions since it is expected that a given projection exposure system would be used for a variety of applications.

An existing illumination system is modified by adding a masking aperture in the illumination pupil plane, fabricated as an optical component reticle, patterned and dithered into a large number of elements to allow for control of the projected light distribution at the mask plane and inserted at the condenser lens pupil plane. This masking aperture comprises a translucent substrate and a masking film. The distribution of the intensity through the masking aperture in the illumination pupil plane is determined to provide optimized Gaussian-type illumination. The illumination region or regions exhibit varying intensity, which is accomplished by creating a half-tone pattern via pixelation of the masking film, thereby allowing for maximum variation in illumination beyond the simple binary (clear or opaque) situation possible with earlier aperture filtering approaches.

More specifically, one aspect of the invention includes an aperture mask for an illumination system to provide controlled Gaussian-type illumination. The aperture mask is divided into an array of elements and each element contains an array of pixels. Each of the elements is constructed with a matrix of pixels. The elements are patterned in accordance with a selected wavelength of incident light to diffract the incident light into an illumination pattern for illuminating a photomask.

The intensity is modulated by the intensity state of pixels within each element. The highest intensity element has all pixels clear or maximum intensity. Light of suitable wavelength passes through without attenuation. An element with all pixels having dark or minimum intensity attenuates or blocks all light. Elements of intensity between none (0%) and all (100%) are created by the state of the pixels in a given element. Random patterns and other patterns between elements may produce artifacts similar to moire patterns. Such artifacts are undesired. I discovered that a dithered pattern using position dependent thresholds produced illumination patterns that had little or no artifacts.

In another embodiment, the use of traditional optical components can also be used to achieve a Gaussian illumination shape. These include beamsplitters, prisms, lenses, or diffractive optical elements (DOEs).

DETAILED DESCRIPTION OF THE INVENTION

Gaussian-type illumination, or illumination that provides greater intensity in a central region and less intensity at the edges of an illumination profile, can reduce the adverse impact of aberrations when imaging with phase-shift masks. Such illuminations can be achieved using beam shaping methods within a Köhler illumination system or with an aperture mask dithered to represent a continuous tone. Diffractive optical element (DOE) approaches now common to lithographic illumination systems can also be utilized.

Figure 1A:
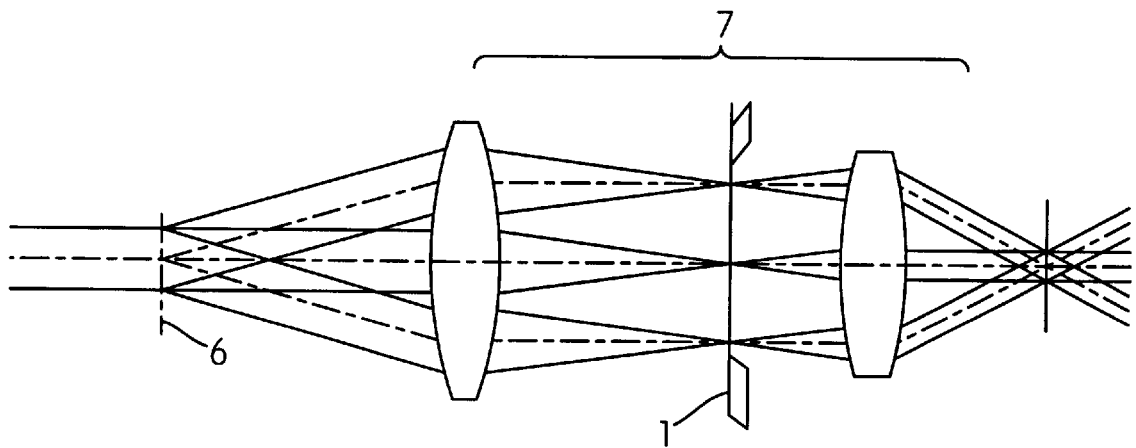
FIG. 1a is a schematic view of an illumination system for a photomask.
Figure 1B:
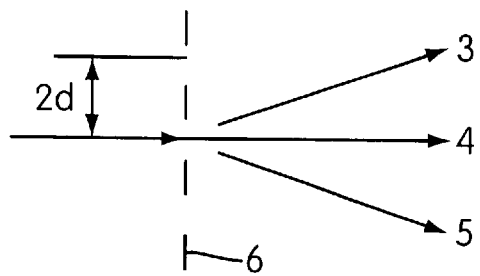
FIG. 1b shows the zero-th and first positive and first negative diffraction rays.
Figure 2:
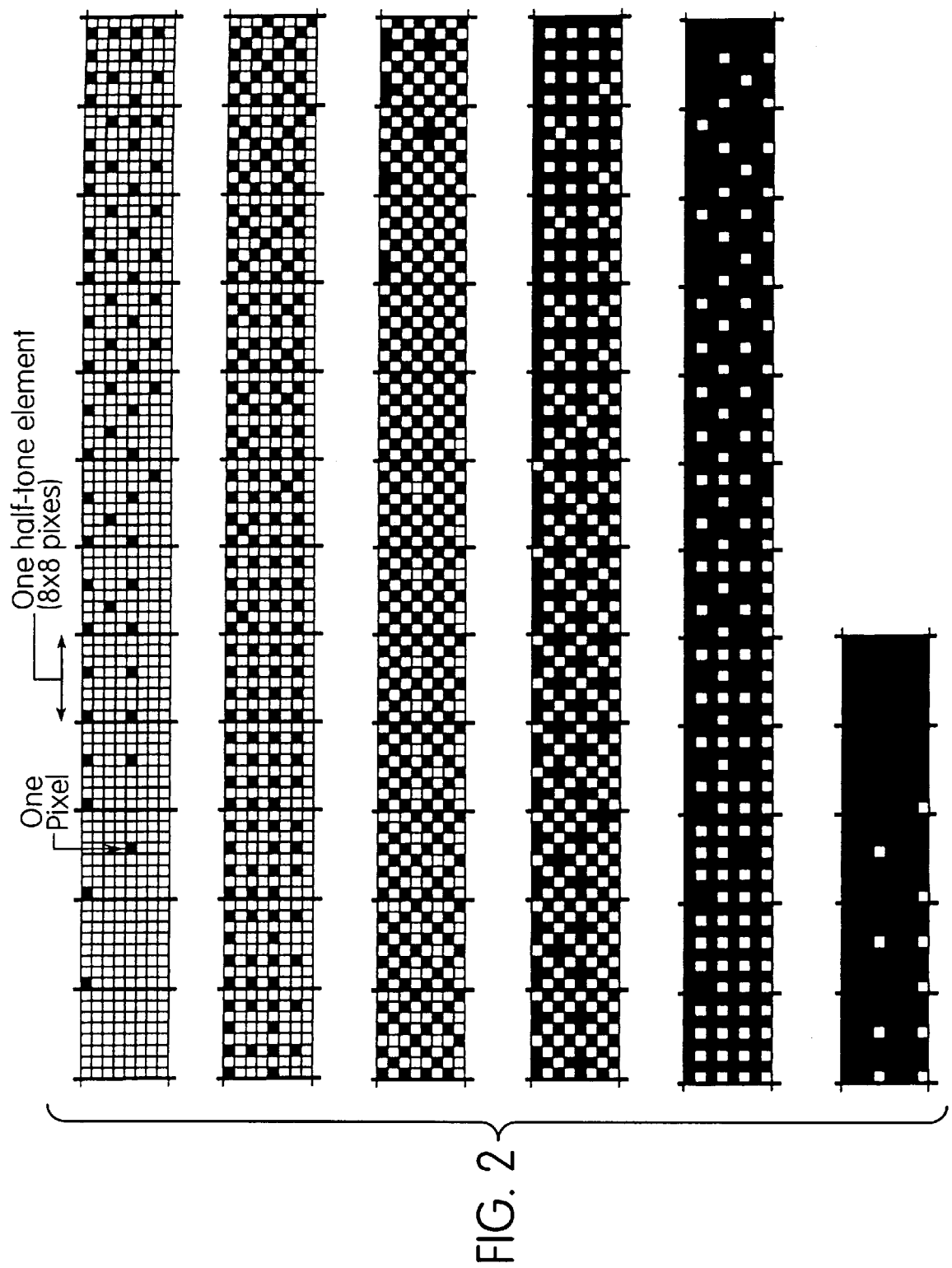
FIG. 2 is a schematic representation of the bilevel representation of 65 gray levels using the ordered dithering algorithm.
Figure 3A:
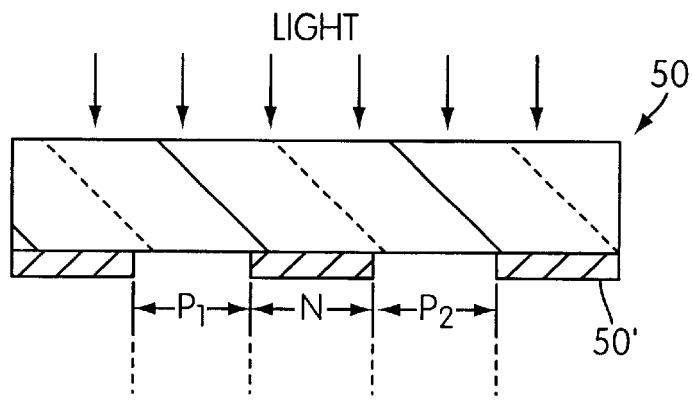
FIGS. 3(a) to 3(d) is schematic representations of diffraction effects using a prior art ordinary binary transmission mask in photolithography.
Figure 3B:
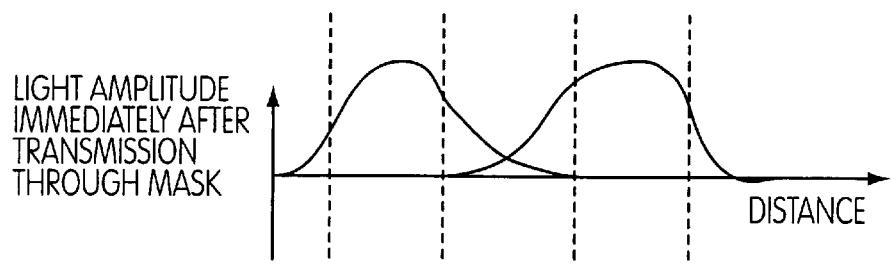
Figure 3C:
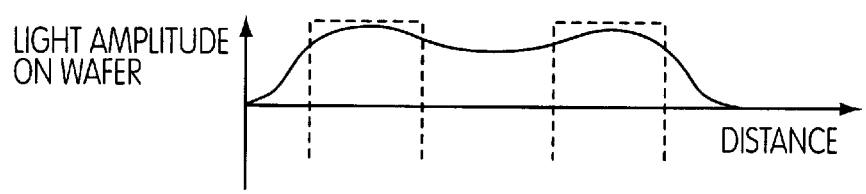
Figure 3D:
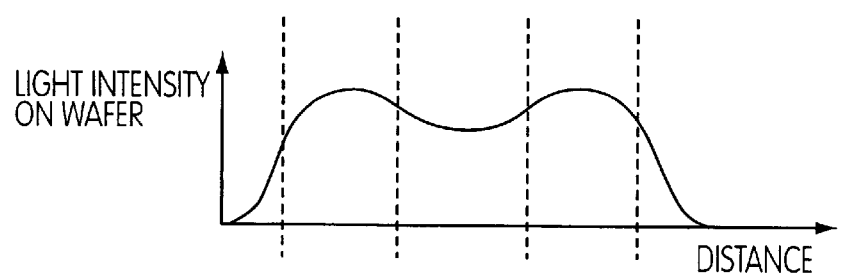
Figure 4A:
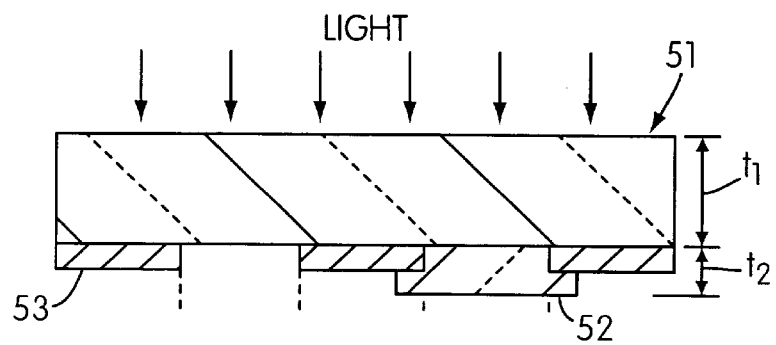
FIGS. 4(a) to 4(d) are schematic representations of diffraction effects and the use of prior art phase shift masking (PSM) to compensate for the effects of diffraction.
Figure 4B:
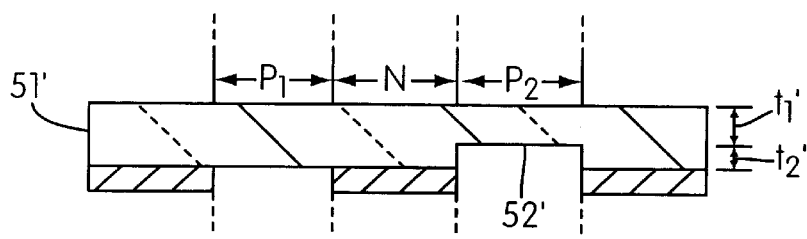
Figure 4C:
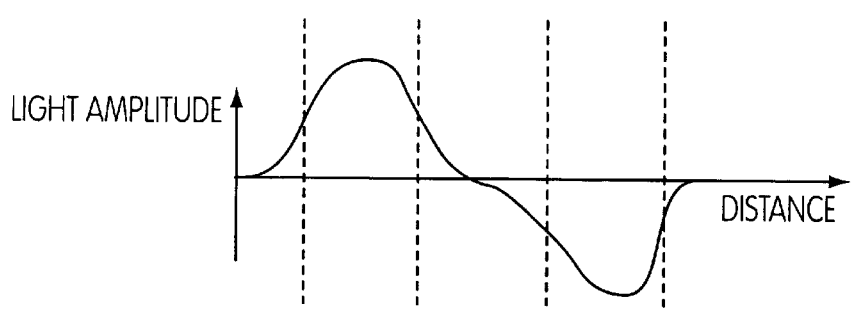
Figure 4D:
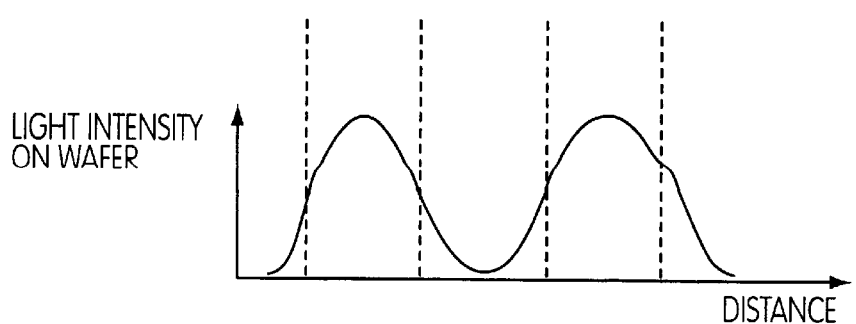
Figure 5:
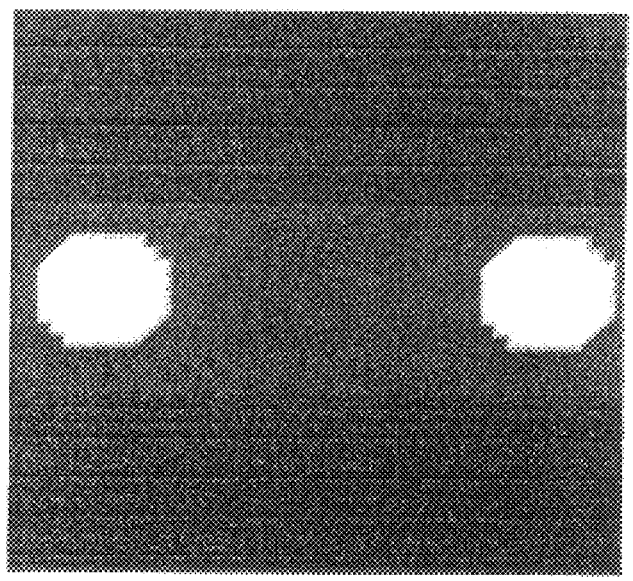
FIG. 5 shows a diffraction field for strong PSM with conventional low-sigma illumination.

FIG. 5 shows how phase shift masking (PSM) influences the aberration impact on imaging where diffraction energy is distributed at radial positions in the pupil. Table 3 summarizes the impact of aberration on imaging with a phase-shift mask. For each case, 0.25 waves of aberration are studied. In the table, RMS=root mean square optical path difference; Marechal is an approximation of the Strehl ratio, a measurement of the ratio of an aberrated point spread function to an ideal point spread function. RMS of primary aberrations is shown for full pupil use. Using strong phase shift masking with conventional circular illumination sigma values of 0.1, in all cases of pitch size (in terms of k/2), symmetrical aberrations are improved, measured by RMS of the aberration over the utilized pupil. The improvement is a function of the radial portion of the pupil utilized, which is governed by the pitch, NA, and wavelength of illumination. For defocus, there is most improvement for features corresponding to pitch k/2=0.42, which places orders at a position of 60% of the full pupil. For spherical aberration, most improvement is obtained at pitch k/2=0.70, These values are a function of the character of the primary aberrations. For asymmetrical aberrations, the situation is such that phase shift masking worsens the impact, measured also in terms of RMS of the aberration across the utilized pupil. For astigmatism, features corresponding to k/2=0.31 are impacted most significantly, which is at the 80% pupil position. Coma shows the most impact for k/2=0.42, or at a 60% pupil position. These values are also a result of the character of the primary aberrations.

TABLE 3

| 0.25W | | Full Pupil | PSM pitch(k/2)/sigma | | | | PSM pitch (k/w)/Gaussian sigma | | | | |
|---|---|---|---|---|---|---|---|---|---|---|---|
| | | | 0.42/0.1 | 0.36/0.1 | 0.31/0.2 | 0.24/0.2 | 0.42/0.3 | 0.36/0.2 | 0.36/0.3 | 0.31/0.2 | 0.31/0.3 |
| Defocus | RMS (φ) | 0.468 | 0.108 | 0.140 | 0.146 | 0.193 | 0.28u5 | 0.204 | 0.297 | 0.236 | 0.305 |
| | Marechal | 0.793 | 0.988 | 0.981 | 0.979 | 0.963 | 0.920 | 0.959 | 0.914 | 0.945 | 0.909 |
| Spherical | RMS (φ) | 0.364 | 0.094 | 0.032 | 0.139 | 0.170 | 0.231 | 0.198 | 0.251 | 0.227 | 0.268 |
| | Marechal | 0.872 | 0.991 | 0.999 | 0.981 | 0.971 | 0.947 | 0.961 | 0.938 | 0.949 | 0.929 |
| Astigmatism | RMS (φ) | 0.313 | 0.211 | 0.274 | 0.355 | 0.162 | 0.216 | 0.216 | 0.258 | 0.261 | 0.286 |
| | Marechal | 0.905 | 0.956 | 0.926 | 0.878 | 0.974 | 0.954 | 0.954 | 0.934 | 0.933 | 0.920 |
| Coma | RMS (φ) | 0.283 | 0.302 | 0.214 | 0.134 | 0.175 | 0.208 | 0.220 | 0.210 | 0.168 | 0.211 |
| | Marechal | 0.921 | 0.911 | 0.955 | 0.982 | 0.970 | 0.957 | 0.952 | 0.956 | 0.972 | 0.956 |

Also shown in Table 3 is the impact that Gaussian illumination has on the influence of aberrations with PSM. In each case shown the reduction in the impact of symmetrical aberrations is not as significant as that with conventional circular sigma illumination. There is, however, improvement over full pupil utilization. For asymmetrical aberrations (such as coma and astigmatism), the situation is very significant. For example, using a 0.3 Gaussian half width sigma value, 0.42, 0.36, and 0.31 k/2 pitch value features can be imaged using PSM with reduction in RMS for coma and astigmatism over that for the full pupil. This leads to a more universal phase shift mask solution that can improve imaging resolution in terms of image modulation as well as image placement error and image X/Y biasing.

Figure 6A:
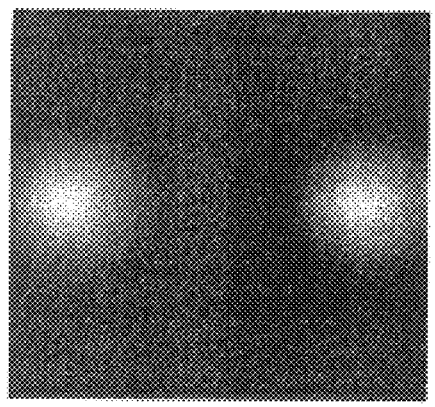
FIGS. 6(a) and 6(b) show diffraction fields for strong PSM with Gaussian illumination with 0.2 sigma (left) and 0.3 sigma (right).
Figure 6B:
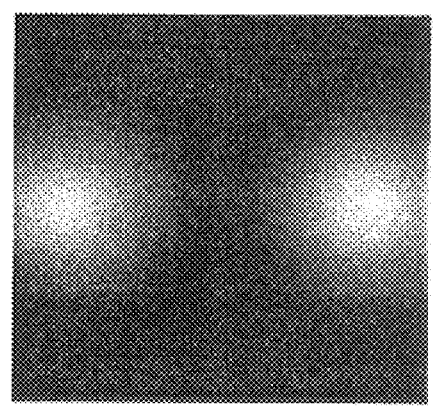
Figure 7A:
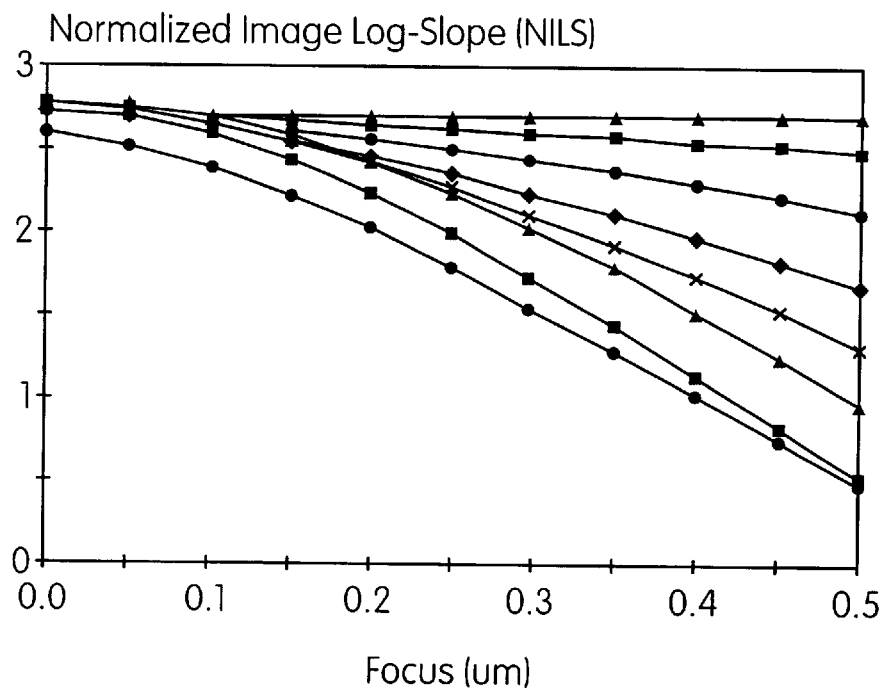
FIGS. 7(a) and 7(b) are graphs of NILS vs. focus for circular illumination, 0.2 sigma and for Gaussian illumination, 0.2 sigma, respectively.
Figure 7B:
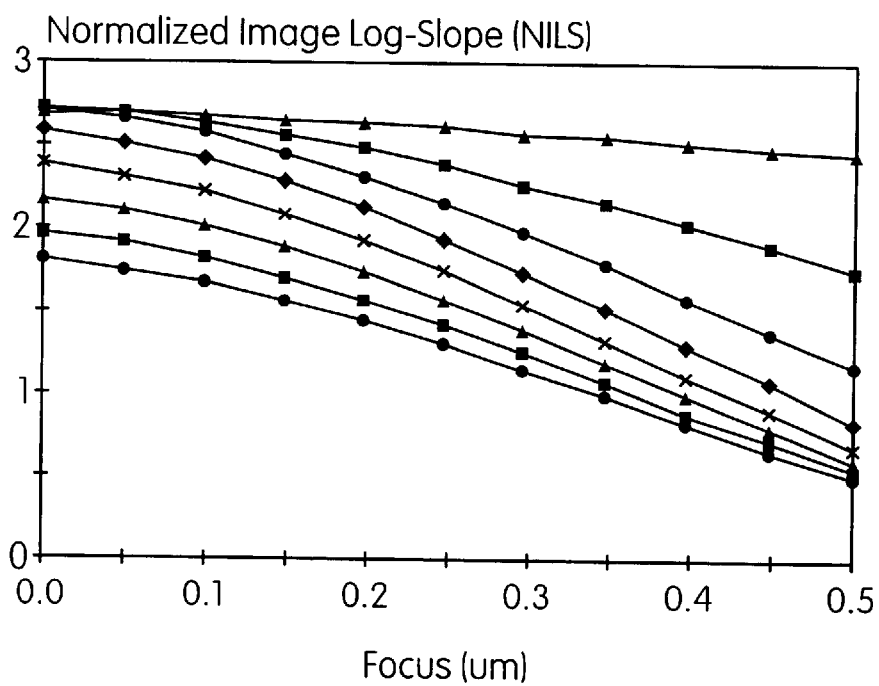
Figure 8A:
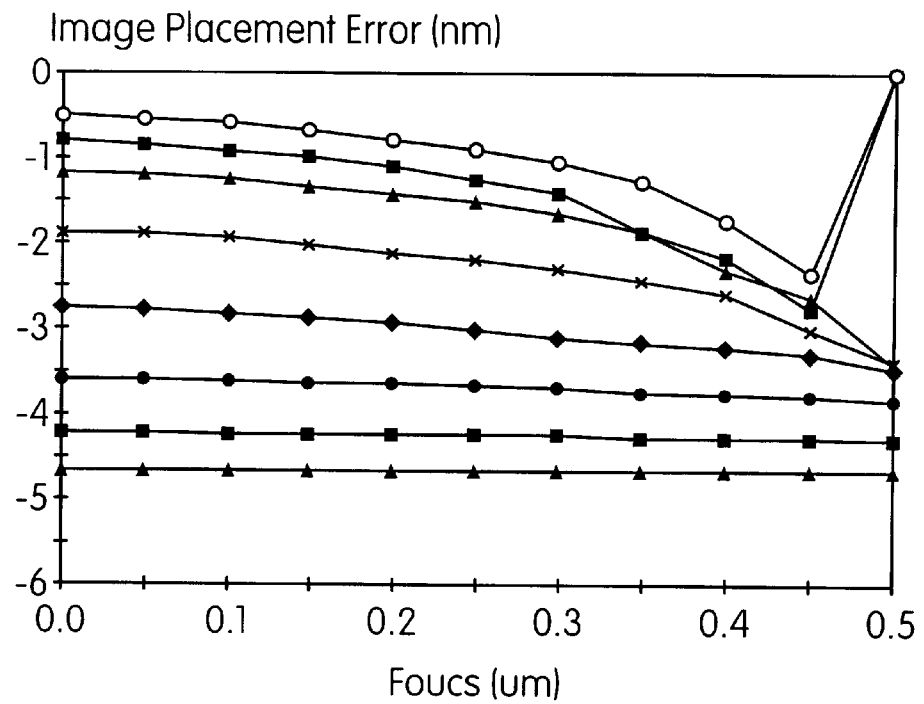
FIGS. 8(a) and 8(b) are graphs of IPE vs. focus for circular illumination, 0.2 sigma and for Gaussian illumination, 0.2 sigma, respectively.
Figure 8B:
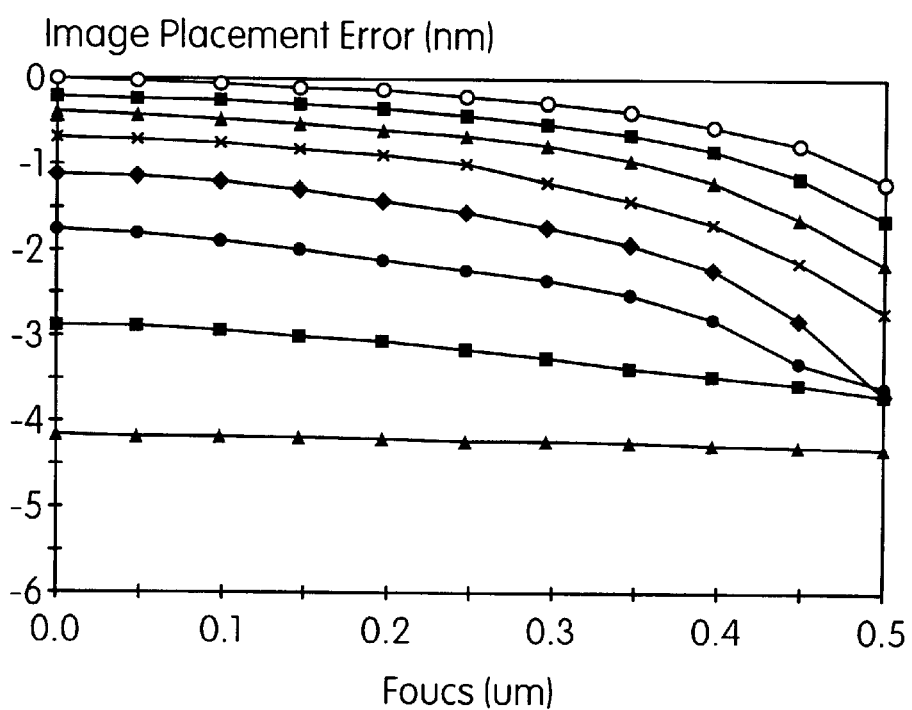

FIGS. 6(a) and 6(b) show the diffraction field for Gaussian-type illumination of a phase shift mask with 0.2 and 0.3 sigma half width. From Table 4, the optimum illumination condition can be determined through evaluation of primary aberrations. To reduce asymmetrical aberration while maintaining good performance with symmetrical aberration, a Gaussian sigma half-width value of 0.20 might be chosen. FIGS. 7(a) and 7(b) show an example with a real lens aberration description. In this case, 140 nm features (1:1) are imaged with 248 nm wavelength and 0.60NA. Normalized image log-slope (NILS) is measured as the slope of the log of the aerial image. It is seen here that the NILS through focus is superior for the circular illumination performance compared to the Gaussian illumination. However, when evaluating the image placement error (IPE) induced by aberration, shown in FIGS. 8(a) and 8(b), the Gaussian-type illumination is far superior. The improvement is due to the reduction in the impact from asymmetrical aberrations. This is a significant result of this invention.

where the falloff from the central portion may vary in shape or slope. The preferred distribution is circular and uses a round central opening with radial decreasing intensity from the center but with substantially the same intensity at any given radius. The Gaussian profile is projected into the pupil of the objective lens 93, In doing so, it illuminates the phase shift mask 94 with a Fourier Transform of the Gaussian illumination lens 93 onto a photosensitive surface of a semiconductor wafer 95.

The half-tone diffraction mask comprises an array of pixels, each pixel is of a clear or opaque type and of the same size. The clear and opaque pixels are arranged and configured to respectively pass and block incident light. The number, size, and type of the pixels are chosen in accordance with the wavelength of light used to illuminate the photomask. The relative intensity of each pixel is defined by a recursion relationship where:

TABLE 4

| | | 0.25W | | | | | | | |
|---|---|---|---|---|---|---|---|---|---|
| | | Defocus | | Spherical | | Astigmatism | | Coma | |
| | | RMS ($\phi$) | Marechal | RMS ($\phi$) | Marechal | RMS ($\phi$) | Marechal | RMS ($\phi$) | Marechal |
| | Full pupil | 0.468 | 0.793 | 0.364 | 0.872 | 0.313 | 0.905 | 0.284 | 0.921 |
| Radial | 0.1$\sigma$ | 0.140 | 0.981 | 0.032 | 0.999 | 0.274 | 0.926 | 0.214 | 0.955 |
| Radial | 0.2$\sigma$ | 0.254 | 0.937 | 0.112 | 0.987 | 0.293 | 0.916 | 0.213 | 0.955 |
| Gaussian | 0.2$\sigma$ | 0.204 | 0.959 | 0.198 | 0.961 | 0.216 | 0.954 | 0.220 | 0.952 |
| Gaussian | 0.3$\sigma$ | 0.297 | 0.914 | 0.251 | 0.938 | 0.258 | 0.934 | 0.210 | 0.956 |

The invention is implemented in existing illumination systems is accomplished via access to the illumination optical system. In one embodiment, pixilated half-tone illumination files are transferred lithographically onto a transparent substrate, such as fused silica, coated with a suitably opaque masking layer, such as chromium. A photoresist film coated over the metal coated transparent substrate is exposed using optical, electron beam, or other methods by translating the bi-level illumination representation into a suitable machine-readable format. Photoresist development and subsequent etching of the underlying masking film allows transfer of the pattern to the masking aperture. An anti-reflective layer can be coated over the masking film prior to photoresist coating, exposure, and processing to reduce reflection, stray light, and flare effects in the illumination field of the exposure tool. An anti-reflective layer can be coated over the patterned aperture to match reflectances over the entire illumination field. Alignment of apertures is made possible by incorporating alignment fiducials on the masking apertures and on an aperture holders used to mount the invention into the exposure tool illumination system. Apertures can be inserted into as pupil plane of the illumination system.

Figure 9:
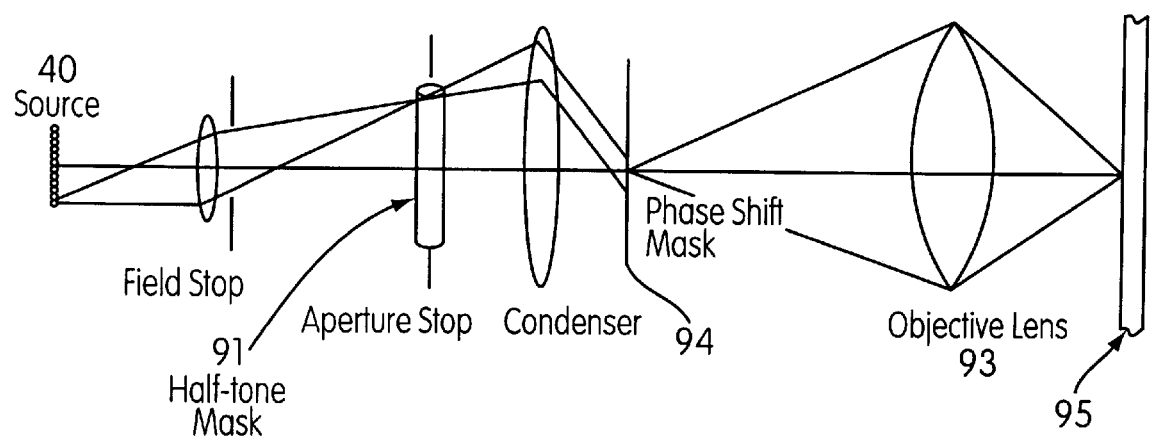
FIG. 9 is schematic of a photolithographic apparatus using a dithered mask to reduce lens aberrations.
Figure 10:
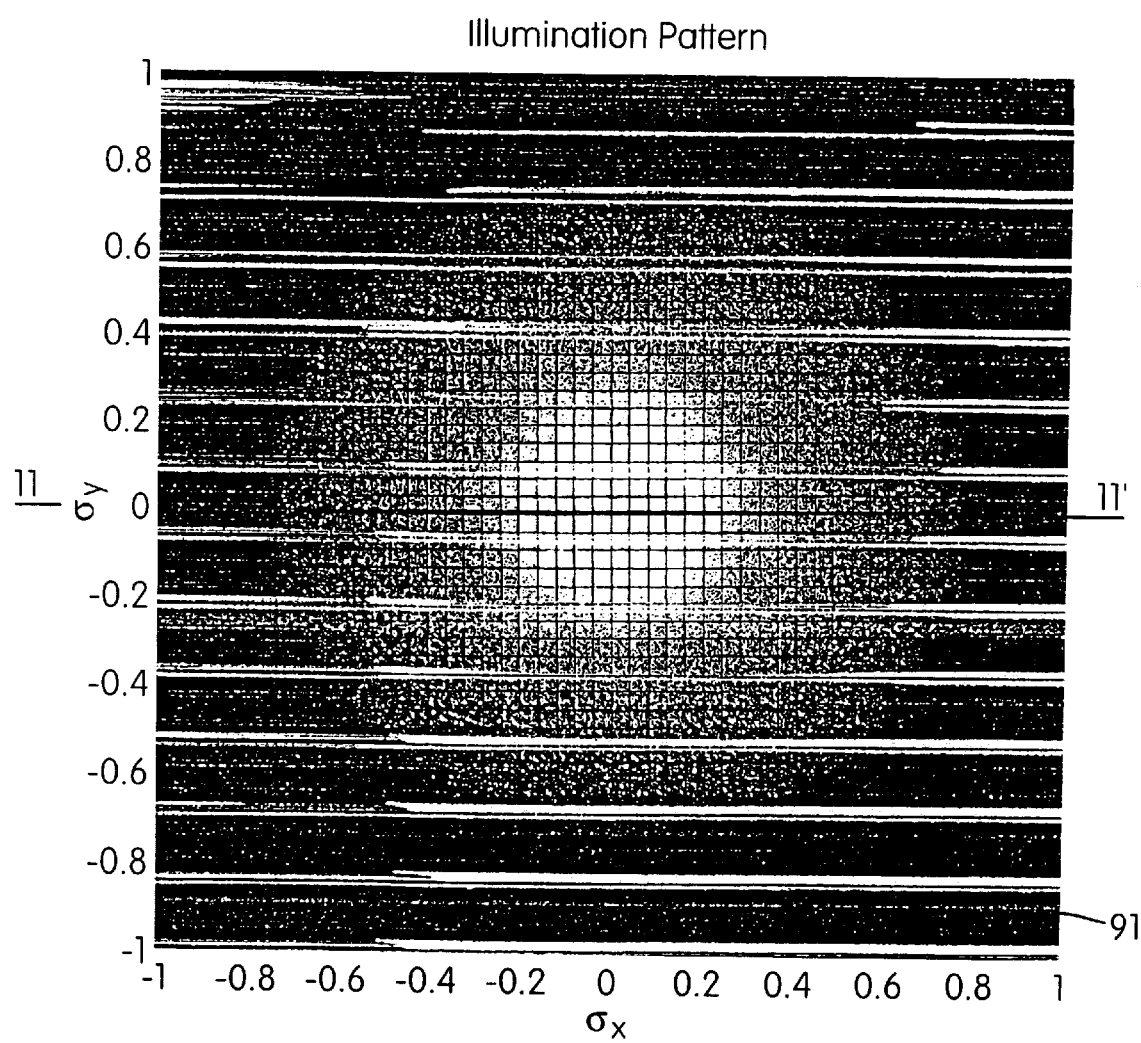
FIG. 10 is an enlarged plan view of a typical dithered mask for generating a Gaussian distribution.
Figure 11:
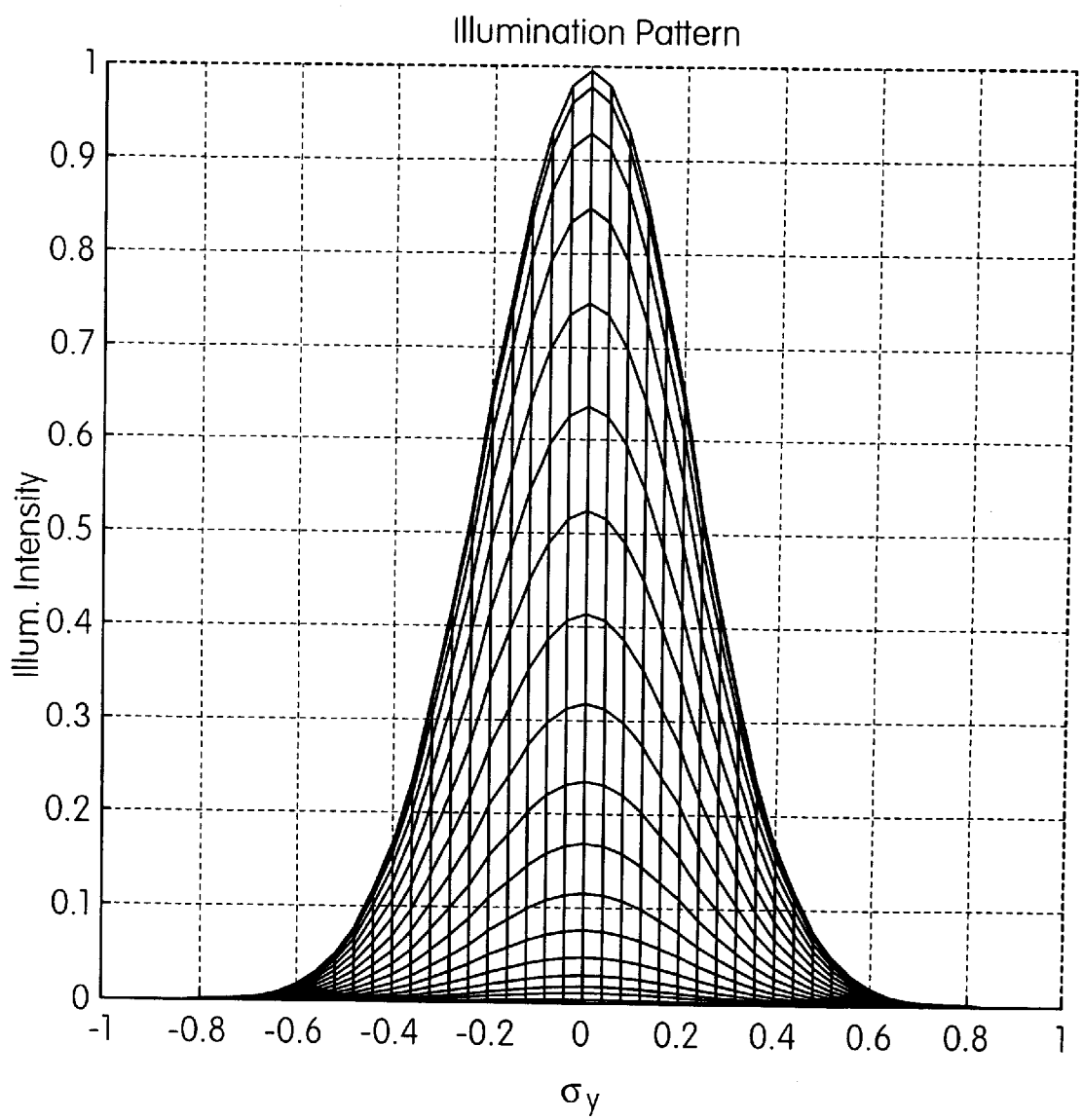
FIG. 11 is a graph showing the value of light intensity across the line 11–11' of FIG. 10.

One embodiment is shown in FIGS. 9–11, There a light source 90 generates a light beam that is directed through a condenser lens system. Within this system, a half-tone dithered mask is placed on the condenser lens pupil plane. The halftone mask 91 controls and shapes the light beam into a Gaussian intensity distribution. Details of a mask with a circular shaped central opening are shown in FIG. 10. In FIG. 11 one sees that the intensity falls off as the distance from the center increases. Other shapes are also possible $$D^n = \begin{vmatrix} 4D^{n/2} + D_{00}^2 U^{n/2} & 4D^{n/2} + D_{01}^2 U^{n/2} \\ 4D^{n/2} + D_{10}^2 U^{n/2} & 4D^{n/2} + D_{11}^2 U^{n/2} \end{vmatrix}$$

where:

$$U^n = \begin{vmatrix} 1 & 1 & \cdots & 1 \\ 1 & & & \\ \vdots & & & \\ 1 & & & \end{vmatrix}$$

to produce a 8×8 matrix of pixels and the relative intensity, D8, comprises:

$$D^8 = \begin{vmatrix} 0 & 32 & 8 & 40 & 2 & 34 & 10 & 42 \\ 48 & 16 & 56 & 24 & 50 & 18 & 58 & 26 \\ 12 & 44 & 4 & 36 & 14 & 46 & 6 & 38 \\ 60 & 28 & 52 & 20 & 62 & 30 & 54 & 22 \\ 3 & 35 & 11 & 43 & 1 & 33 & 9 & 41 \\ 51 & 19 & 59 & 27 & 49 & 17 & 57 & 25 \\ 15 & 47 & 7 & 39 & 13 & 45 & 5 & 37 \\ 63 & 31 & 55 & 23 & 61 & 29 & 53 & 21 \end{vmatrix}$$

Figure 12:
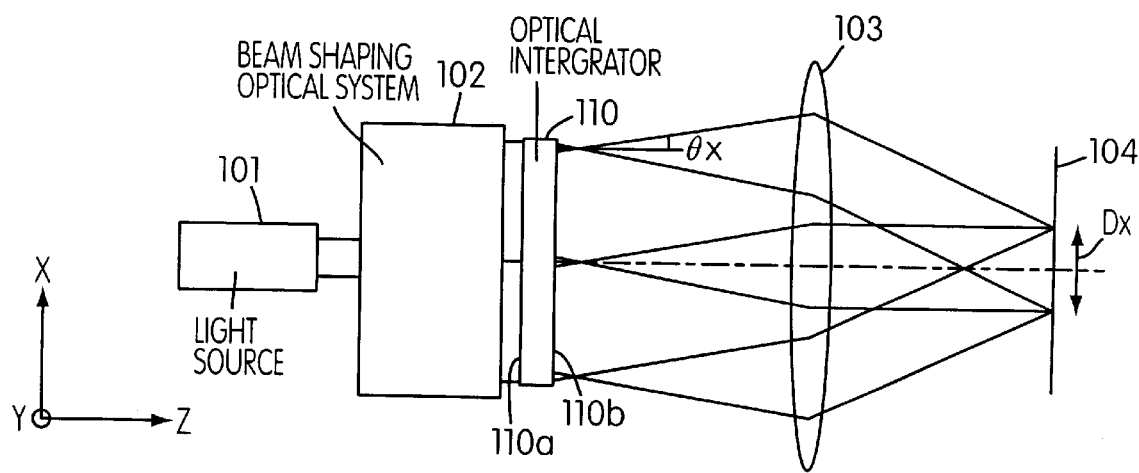
FIG. 12 is schematic of a conventional lithographic illumination system that generates a Gaussian distribution.

In a second embodiment, a beam-shaping optical system of an illumination system (FIG. 12) is modified to produce the desired Gaussian illumination. The illumination optical system contains a beam shaping optical system 102 and an optical integrator 110, A light source such as a mercury lamp or an excimer layer 101 is used for illumination. The beam shaping optical system 102 shapes the light beam coming from the source 101 into the Gaussian shape and directs this shaped beam onto the surface of an optical integrator 110, The optical integrator can consist of, for example, a fly's-eye array or one or more diffractive optical elements. The condenser lens system 103 illuminates the mask with Köhler illumination. The intensity distribution in the plane 104 is a result of the Gaussian shaping of the illuminator and is the Fourier Transform of the illuminated shape. Since Köhler illumination systems are used extensively in lithographic applications and are well known to those of ordinary skill in the art of illumination system design, details of the beam shaping optical system will not be detailed here. The beam shaping optical system can contain one or more optical elements, which can include lenses, prisms, cones, and other similar components. See, for example, U.S. Pat. No. 5,644,383, issued Jul. 1, 1997 to Mori. As one might expect, that patent discloses a method for minimizing any Gaussian-type distribution of light in the photolithographic apparatus contrary to my invention. If the Mori device is used with a phase shift photomask, the beneficial effects of Gaussian distribution are eliminated before the light illuminates the phase shift photomask.

The present invention is described above but it is to be understood that it is not limited to these descriptive examples. The numerical values, specific shaping, skewing, kurtosis, or intensity distribution of the illumination may be changed to accommodate specific conditions of masking, aberration, feature orientation, duty ratio requirements, lens parameters, initial illumination non-uniformnities, and the like as required to achieve high integrated circuit pattern resolution. Specific phase-shift mask conditions can also be modified. Results can also be obtained by controlling illumination at any Fourier Transform plane in the illumination system.

What is claimed:

1. A method for illuminating a phase shift photomask to reduce aberrations of an objective lens, in a photolithographic apparatus, wherein the aberrations are exaggerated by the phase shift photomask, the method comprising:

generating light for illuminating an aperture of the objective lens;

controlling the intensity of the light and shaping the light into a Gaussian-type intensity distribution pattern across the aperture to reduce exaggerations of aberrations of an objective lens;

providing phase shift photomask with an object pattern in the path of the Gaussian intensity distribution pattern;

projecting an image of the phase shift photomask object pattern through an objective lens with aberrations, whereby the Gaussian-type distribution pattern reduces the aberration exaggerations caused by the phase shift photomask.

2. The method of claim 1, wherein the light is controlled and shaped into a Gaussian intensity distribution pattern by diffracting the light through a masking aperture having a half tone diffraction pattern of dithered pixels patterned for distributing the light into a Gaussian intensity distribution pattern.

3. The method of claim 1, wherein the light is controlled and shaped by one or more optical elements.

4. The method of claim 1, wherein the aberrations are symmetrical and asymmetrical.

5. The method of claim 1, wherein the aberrations comprising defocus, spherical, astigmatism, coma, and higher order aberrations.

6. The method of claim 5, wherein the Gaussian distribution pattern reduces the asymmetrical aberrations more than a full or circular pupil.

7. A method for illuminating a phase shift photomask to reduce aberrations of an objective lens, in a photolithographic apparatus, wherein the aberrations are exaggerated by the phase shift photomask, the method comprising:

generating light for illuminating an aperture of the objective lens;

controlling the intensity of the light and shaping the light into a Gaussian intensity distribution pattern across the aperture to reduce exaggerations of aberrations of an objective lens by diffracting the light with a diffraction masking aperture having a half tone diffraction pattern of dithered pixels patterned for distributing the light into a Gaussian intensity distribution pattern;

providing phase shift photomask with an object pattern in the path of the Gaussian intensity distribution pattern;

projecting an image of the phase shift photomask object pattern through an objective lens with aberrations, whereby the Gaussian distribution pattern reduces the aberration exaggerations caused by the phase shift photomask.

8. The method of claim 7, wherein the half-tone diffraction masking aperture comprises an array of pixels, each pixel of a clear or opaque type and of the same size, said clear and opaque pixels for respectively passing and blocking incident light, wherein the number, size, and type of the pixels are chosen in accordance with:

the wavelength of light used to illuminate the photomask, and the size and shape of the features of the phase shift photomask, for generating a Gaussian illumination intensity pattern on the phase shift photomask.

9. The method of claim 7, wherein each diffraction element comprise an n×n dithered matrix of pixels, the intensity of each element is defined by the number and type of pixels in its dithered matrix and wherein the pixels in each matrix are dithered to avoid artifacts.

10. The method of claim 8, wherein the relative intensity of each pixel is defined by a recursion relationship where:

$$D^n = \begin{vmatrix} 4D^{n/2} + D_{00}^2 U^{n/2} & 4D^{n/2} + D_{01}^2 U^{n/2} \\ 4D^{n/2} + D_{10}^2 U^{n/2} & 4D^{n/2} + D_{11}^2 U^{n/2} \end{vmatrix}$$

where:

$$U^n = \begin{vmatrix} 1 & 1 & \cdots & 1 \\ 1 & & & \\ \vdots & & & \\ 1 & & & \end{vmatrix}.$$

11. The method of claim 10, wherein the matrix of pixels comprises an 8×8 matrix and the relative intensity, D8, comprises:

$$D^8 = \begin{vmatrix} 0 & 32 & 8 & 40 & 2 & 34 & 10 & 42 \\ 48 & 16 & 56 & 24 & 50 & 18 & 58 & 26 \\ 12 & 44 & 4 & 36 & 14 & 46 & 6 & 38 \\ 60 & 28 & 52 & 20 & 62 & 30 & 54 & 22 \\ 3 & 35 & 11 & 43 & 1 & 33 & 9 & 41 \\ 51 & 19 & 59 & 27 & 49 & 17 & 57 & 25 \\ 15 & 47 & 7 & 39 & 13 & 45 & 5 & 37 \\ 63 & 31 & 55 & 23 & 61 & 29 & 53 & 21 \end{vmatrix}.$$

12. The method of claim 8, wherein the matrix of diffracting elements is selected from the group consisting of 2×2, 4×4, 8×8, 16×16, 32×32 and 64×64.

13. A photolithographic apparatus comprising:
a light source constructed and arranged to illuminate a projection imaging system;
a light controller constructed and arranged to control the intensity of the light and to shape the light into a Gaussian intensity illumination distribution pattern to reduce exaggerations of aberrations of an objective lens;
a phase shift photomask with an object pattern and disposed in the path of the Gaussian intensity distribution pattern, said phase shift photomask exaggerating aberrations in the objective lens;
an objective lens with aberrations for receiving the projected image of the phase shift photomask object pattern, whereby the Gaussian intensity illumination distribution pattern reduces aberration exaggerations caused by the phase shift photomask.

14. The photolithographic apparatus of claim 13, wherein the light controller comprises a diffraction masking aperture having a half tone diffraction pattern of dithered pixels patterned to distribute the light into a Gaussian intensity distribution pattern.

15. The photolithographic apparatus of claim 13, wherein the light controller comprises one or more optical elements.

16. The photolithographic apparatus of claim 13, wherein said light controller comprises a half-tone diffraction masking aperture comprising an array of pixels, each pixel of a clear or opaque type and of the same size, said clear and opaque pixels for respectively passing and blocking incident light, wherein the number, size, and type of the pixels are chosen in accordance with the wavelength of light used to illuminate the photomask, and the size and shape of the features of the phase shift photomask, to generate a Gaussian illumination intensity pattern on the phase shift photomask.

17. The photolithographic apparatus of claim 16, wherein the half-tone dithered image comprises an array of diffraction elements and each diffraction element is a dithered image of clear or opaque pixels.

18. The photolithographic apparatus of claim 17, wherein each diffraction element comprise an n×n dithered matrix of pixels, the intensity of each element is defined by the number and type of pixels in its dithered matrix and wherein the pixels in each matrix are dithered to avoid artifacts.

19. The photolithographic apparatus of claim 18, wherein the matrix of diffracting elements is selected from the group consisting of 2×2, 4×4, 8×8, 16×16, 32×32 and 64×64.

20. The photolithographic apparatus of claim 17, wherein the relative intensity of each subpixel is defined by a recursion relationship where:

$$D^n = \begin{vmatrix} 4D^{n/2} + D_{00}^2 U^{n/2} & 4D^{n/2} + D_{01}^2 U^{n/2} \\ 4D^{n/2} + D_{10}^2 U^{n/2} & 4D^{n/2} + D_{11}^2 U^{n/2} \end{vmatrix}$$

where:

$$U^n = \begin{vmatrix} 1 & 1 & \cdots & 1 \\ 1 & & & \\ \vdots & & & \\ 1 & & & \end{vmatrix}.$$

21. The photolithographic apparatus of claim 20, wherein the matrix of pixels comprises an 8×8 matrix and the relative intensity, D8, comprises:

$$D^8 = \begin{vmatrix} 0 & 32 & 8 & 40 & 2 & 34 & 10 & 42 \\ 48 & 16 & 56 & 24 & 50 & 18 & 58 & 26 \\ 12 & 44 & 4 & 36 & 14 & 46 & 6 & 38 \\ 60 & 28 & 52 & 20 & 62 & 30 & 54 & 22 \\ 3 & 35 & 11 & 43 & 1 & 33 & 9 & 41 \\ 51 & 19 & 59 & 27 & 49 & 17 & 57 & 25 \\ 15 & 47 & 7 & 39 & 13 & 45 & 5 & 37 \\ 63 & 31 & 55 & 23 & 61 & 29 & 53 & 21 \end{vmatrix}.$$

22. A method for illuminating a phase shift photomask to reduce aberrations of an objective lens, in a photolithographic apparatus, wherein the aberrations are exaggerated by the phase shift photomask, the method comprising:
generating light for illuminating an aperture of the objective lens;
controlling the intensity of the light and shaping the light into a Gaussian-type intensity distribution pattern across the aperture to reduce exaggerations of aberrations of an objective lens;
providing phase shift photomask with an object pattern in the path of the Gaussian intensity distribution pattern; and
projecting an image of the phase shift photomask object pattern through an objective lens with aberrations, whereby the Gaussian-type distribution pattern reduces the aberration exaggerations caused by the phase shift photomask,
wherein the light is controlled and shaped into a Gaussian intensity distribution pattern by diffracting the light through a masking aperture having a half tone diffraction pattern of dithered pixels patterned for distributing the light into a Gaussian intensity distribution pattern.

23. The method of claim 22, wherein the light is controlled and shaped by one or more optical elements.

24. The method of claim 22, wherein the aberrations are symmetrical and asymmetrical.

25. The method of claim 22, wherein the aberrations comprising defocus, spherical, astigmatism, coma, and higher order aberrations.

26. The method of claim 25, wherein the Gaussian distribution pattern reduces the asymmetrical aberrations more than a full or circular pupil.

27. A photolithographic apparatus comprising:
- a light source constructed and arranged to illuminate a projection imaging system;
- a light controller constructed and arranged to control the intensity of the light and to shape the light into a Gaussian intensity illumination distribution pattern to reduce exaggerations of aberrations of an objective lens;
- a phase shift photomask with an object pattern and disposed in the path of the Gaussian intensity distribution pattern, said phase shift photomask exaggerating aberrations in the objective lens; and
- an objective lens with aberrations for receiving the projected image of the phase shift photomask object pattern, whereby the Gaussian intensity illumination distribution pattern reduces aberration exaggerations caused by the phase shift photomask,
- wherein the light controller comprises a diffraction masking aperture having a half tone diffraction pattern of dithered pixels patterned to distribute the light into a Gaussian intensity distribution pattern.

28. The photolithographic apparatus of claim 27,
- wherein the light controller comprises one or more optical elements.

29. A photolithographic apparatus comprising:
- a light source constructed and arranged to illuminate a projection imaging system;
- a light controller constructed and arranged to control the intensity of the light and to shape the light into a Gaussian intensity illumination distribution pattern to reduce exaggerations of aberrations of an objective lens;
- a phase shift photomask with an object pattern and disposed in the path of the Gaussian intensity distribution pattern, said phase shift photomask exaggerating aberrations in the objective lens; and
- an objective lens with aberrations for receiving the projected image of the phase shift photomask object pattern, whereby the Gaussian intensity illumination distribution pattern reduces aberration exaggerations caused by the phase shift photomask,
- wherein said light controller comprises a half-tone diffraction masking aperture comprising an array of pixels, each pixel of a clear or opaque type and of the same size, said clear and opaque pixels for respectively passing and blocking incident light, wherein the number, size, and type of the pixels arc chosen in accordance with the wavelength of light used to illuminate the photomask, and the size and shape of the features of the phase shift photomask, to generate a Gaussian illumination intensity pattern on the phase shift photomask.

30. The photolithographic apparatus of claim 29,
- wherein the half-tone dithered image comprises an array of diffraction elements and each diffraction element is a dithered image of clear or opaque pixels.

* * * * *